US008522106B2

(12) United States Patent
Kang et al.

(10) Patent No.: US 8,522,106 B2
(45) Date of Patent: Aug. 27, 2013

(54) APPARATUS AND METHOD FOR TRANSMITTING DATA USING A CTC (CONVOLUTIONAL TURBO CODE) ENCODER IN A MOBILE COMMUNICATION SYSTEM

(75) Inventors: Seung Hyun Kang, Seoul (KR); Suk Woo Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 231 days.

(21) Appl. No.: 13/054,056

(22) PCT Filed: Jul. 13, 2009

(86) PCT No.: PCT/KR2009/003827
§ 371 (c)(1),
(2), (4) Date: Jan. 13, 2011

(87) PCT Pub. No.: WO2010/008165
PCT Pub. Date: Jan. 21, 2010

(65) Prior Publication Data
US 2011/0113307 A1    May 12, 2011

Related U.S. Application Data

(60) Provisional application No. 61/154,747, filed on Feb. 23, 2009, provisional application No. 61/154,417, filed on Feb. 22, 2009, provisional application No. 61/122,413, filed on Dec. 15, 2008, provisional application No. 61/080,274, filed on Jul. 13, 2008.

(51) Int. Cl.
*H04L 1/18* (2006.01)

(52) U.S. Cl.
USPC ............................. 714/750; 714/755; 714/790

(58) Field of Classification Search
USPC ................. 714/750, 755, 786, 790, 792, 787, 714/788
See application file for complete search history.

(56) References Cited

U.S. PATENT DOCUMENTS

| 6,014,411 A * | 1/2000 | Wang ............................. 375/259 |
| 6,028,897 A * | 2/2000 | Wang ............................. 375/265 |

(Continued)

FOREIGN PATENT DOCUMENTS

| CN | 1264509 | 8/2000 |
| KR | 10-0735433 | 6/2007 |

(Continued)

OTHER PUBLICATIONS

The State Intellectual Property Office of the People's Republic of China Application Serial No. 200980127508.5, Office Action dated Jan. 5, 2013, 5 pages.

*Primary Examiner* — Fritz Alphonse
(74) *Attorney, Agent, or Firm* — Lee, Hong, Degerman, Kang & Waimey

(57) ABSTRACT

Apparatus and method for transmitting data using a CTC (Convolutional Turbo Code) encoder in a mobile communication system. The data transmission method according to the present invention includes: a first encoding step of encoding input data bits inputted through two input terminals of the CTC encoder and outputting first encoding bits; a step of interleaving the input data bits by using four CTC interleaver parameters (P0, P1, P2, and P3) corresponding to the sizes of the input data bits; a second encoding step of encoding the interleaved data bits and outputting second encoding bits; and a step of selectively transmitting the input data bits, the first encoding bits, and the second encoding bits to a receiving side in accordance with a predetermined coding rate.

8 Claims, 4 Drawing Sheets

(56) References Cited

U.S. PATENT DOCUMENTS

| | | | | |
|---|---|---|---|---|
| 6,044,116 A | * | 3/2000 | Wang | 375/265 |
| 6,571,369 B1 | * | 5/2003 | Li | 714/792 |
| 6,836,516 B2 | * | 12/2004 | Wolf | 375/265 |
| 6,868,520 B1 | * | 3/2005 | Fauconnier | 714/790 |
| 2007/0109953 A1 | | 5/2007 | Blankenship et al. | |

FOREIGN PATENT DOCUMENTS

| | | |
|---|---|---|
| KR | 10-0735433 B1 | 7/2007 |
| KR | 10-2008-0010736 A | 1/2008 |
| KR | 1020080010736 | 1/2008 |
| WO | 2008/082430 A1 | 7/2008 |
| WO | 2008082430 | 7/2008 |

* cited by examiner

APPARATUS AND METHOD FOR TRANSMITTING DATA USING A CTC (CONVOLUTIONAL TURBO CODE) ENCODER IN A MOBILE COMMUNICATION SYSTEM

CROSS-REFERENCE TO RELATED APPLICATIONS

This application is a 371 U.S. national stage application of International Application No. PCT/KR2009/003827, filed on Jul. 13, 2009, which claims priority to U.S. Provisional Application Ser. Nos. 61/154,747, filed on Feb. 23, 2009, 61/154, 417, filed on Feb. 22, 2009, 61/122,413, filed on Dec. 15, 2008, and 61/080,274, filed on Jul. 13, 2008, the contents of which are incorporated by reference herein in their entirety.

BACKGROUND OF THE INVENTION

1. Field of the Invention

The present invention relates to an apparatus and method for transmitting data, and more particularly, to an apparatus and method for a transmitting end to transmit data using a Convolutional Turbo Code (CTC) encoder in a mobile communication system.

2. Discussion of the Related Art

In a wireless communication system, portions of transmission data may sometimes be lost at once due to fading. If consecutive data bits are lost at once, this error cannot be recovered from even when a very excellent error correction code is used.

In a wireless communication system, the transmitting end transmits an encoded transmission data sequence after changing the order of the transmission data bits according to a specific pattern using a channel interleaving method rather than transmitting the data bits in an order in which the data bits are input. That is, a burst error that frequently occurs in a radio link can be changed to a random error using channel interleaving.

When error bits are sparsely present among encoded transmission data, the error bits may be corrected using an error correction code such as a convolutional code, a turbo code, or a Low Density Parity Check (LDPC) code.

Basically, turbo coding, which is a channel coding technology, is a scheme which connects convolutional codes through parallel concatenation. The Convolutional Turbo Code (CTC) is one of the channel codes used in mobile Internet services.

As is well known, a next-generation mobile communication system requires reliable transmission of multimedia data at a high speed and requires robust channel coding and an efficient modulation scheme in order to increase reliability of high-speed data transmission. Various coding schemes having specifications enabling high-speed data communication such as convolutional coding or turbo coding have been suggested and introduced in many countries. Such channel coding schemes exhibit better performance depending on an interleaver size or a corresponding data block size. Thus, intensive studies have been carried out on an interleaver that greatly affects turbo code performance.

CTC may support two data block size sets in the case of channel coding in a conventional Institute of Electrical and Electronics Engineers (IEEE) 802.16e system. One of the two data block size sets includes data block sizes of 48, 72, 96, 144, 192, 216, 240, 288, 360, 384, 432, and 480 and the other includes data block sizes of 48, 96, 144, 192, 288, 384, 480, 960, 1920, 2880, 3840, and 4800. However, even when the two data block size sets are combined, data block sizes at great intervals therebetween may be selected from the combined range of 48 to 4800.

Table 1 shows each data block size and values of corresponding CTC interleaver parameters $P_0$, $P_1$, $P_2$, and $P_3$ in the conventional IEEE 802.16e system.

TABLE 1

| index | $N_{EP}$ | $P_0$ | $P_1$ | $P_2$ | $P_3$ |
|---|---|---|---|---|---|
| 1 | 48 | 5 | 0 | 0 | 0 |
| 2 | 72 | 11 | 18 | 0 | 18 |
| 3 | 96 | 13 | 24 | 0 | 24 |
| 4 | 144 | 11 | 6 | 0 | 6 |
| 5 | 192 | 7 | 48 | 24 | 72 |
| 6 | 240 | 13 | 60 | 0 | 60 |
| 7 | 288 | 17 | 74 | 72 | 2 |
| 8 | 360 | 11 | 90 | 0 | 90 |
| 9 | 384 | 11 | 96 | 48 | 144 |
| 10 | 432 | 13 | 108 | 0 | 108 |
| 11 | 480 | 13 | 120 | 60 | 180 |
| 12 | 960 | 53 | 62 | 12 | 2 |
| 13 | 1920 | 43 | 64 | 300 | 824 |
| 14 | 2880 | 43 | 720 | 360 | 540 |
| 15 | 3840 | 31 | 8 | 24 | 16 |
| 16 | 4800 | 53 | 66 | 24 | 2 |

Since a CTC encoder can only support data block sizes corresponding to the preset data block size sets, there is a need to use padding bits when an information block size is not included in the data block size sets. The number of padding bits is equal to the difference between the information block size and the smallest data block size in the set greater than the information block size. Thus, if granularity, which corresponds to the difference between two adjacent data block sizes in a data block size set, is increased in the data block size set, padding overhead is also increased.

The IEEE 802.16e system has great padding overhead since the CTC data block sizes have a great interval of granularity. Thus, although there is a need to define new CTC data block sizes, CTC data block sizes having better granularity have not yet been suggested in the IEEE 802.16m system.

SUMMARY OF THE INVENTION

Accordingly, an object of the present invention is to provide a method for a transmitting end to transmit data using a Convolutional Turbo Code (CTC) encoder in a mobile communication system.

Another object of the present invention is to provide an apparatus for a transmitting end to transmit data using a Convolutional Turbo Code (CTC) encoder in a mobile communication system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for a transmitting data using a Convolutional Turbo Code (CTC) encoder in a mobile communication system includes providing first encoded bits by encoding input data bits inputted to two input ports of the CTC encoder, interleaving the input data bits using 4 CTC interleaver parameters ($P_0$, $P_1$, $P_2$, and $P_3$) corresponding to a size of the input data bits, providing second encoded bits by encoding the interleaved input data bits, and selectively transmitting the input data bits, the first encoded bits, and the second encoded bits according to a predefined code rate, wherein the size of the input data bits is one of M predetermined data bit sizes, and wherein $P_0$ is relative prime number with N which is ½ of the size of the input data bits, $P_1$ is a multiple of 2 among natural numbers, $P_2$ is a multiple of 4 among the natural numbers, and wherein $P_3$ is a multiple of 2 among the natural numbers when ($P_1$ modulo 4)=2, and $P_3$ is a multiple of 4 among the natural numbers when ($P_1$ modulo 4)=0.

In another aspect of the present invention, an apparatus for transmitting data using a Convolutional Turbo Code (CTC) encoder in a mobile communication system includes a first encoder for providing first encoded bits by encoding input data bits inputted to two input ports of the CTC encoder, a CTC interleaver for interleaving the input data bits using 4 CTC interleaver parameters ($P_0$, $P_1$, $P_2$, and $P_3$) corresponding to a size of the input data bits, a second encoder for providing second encoded bits by encoding the interleaved input data bits, and a transmission module for selectively transmitting the input data bits, the first encoded bits, and the second encoded bits according to a predefined code rate, wherein the size of the input data bits is one of M predetermined data bit sizes, and wherein $P_0$ is relative prime number with N which is ½ of the size of the input data bits, $P_1$ is a multiple of 2 among natural numbers, $P_2$ is a multiple of 4 among the natural numbers, and wherein $P_3$ is a multiple of 2 among the natural numbers when ($P_1$ modulo 4)=2, and $P_3$ is a multiple of 4 among the natural numbers when ($P_1$ modulo 4)=0.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
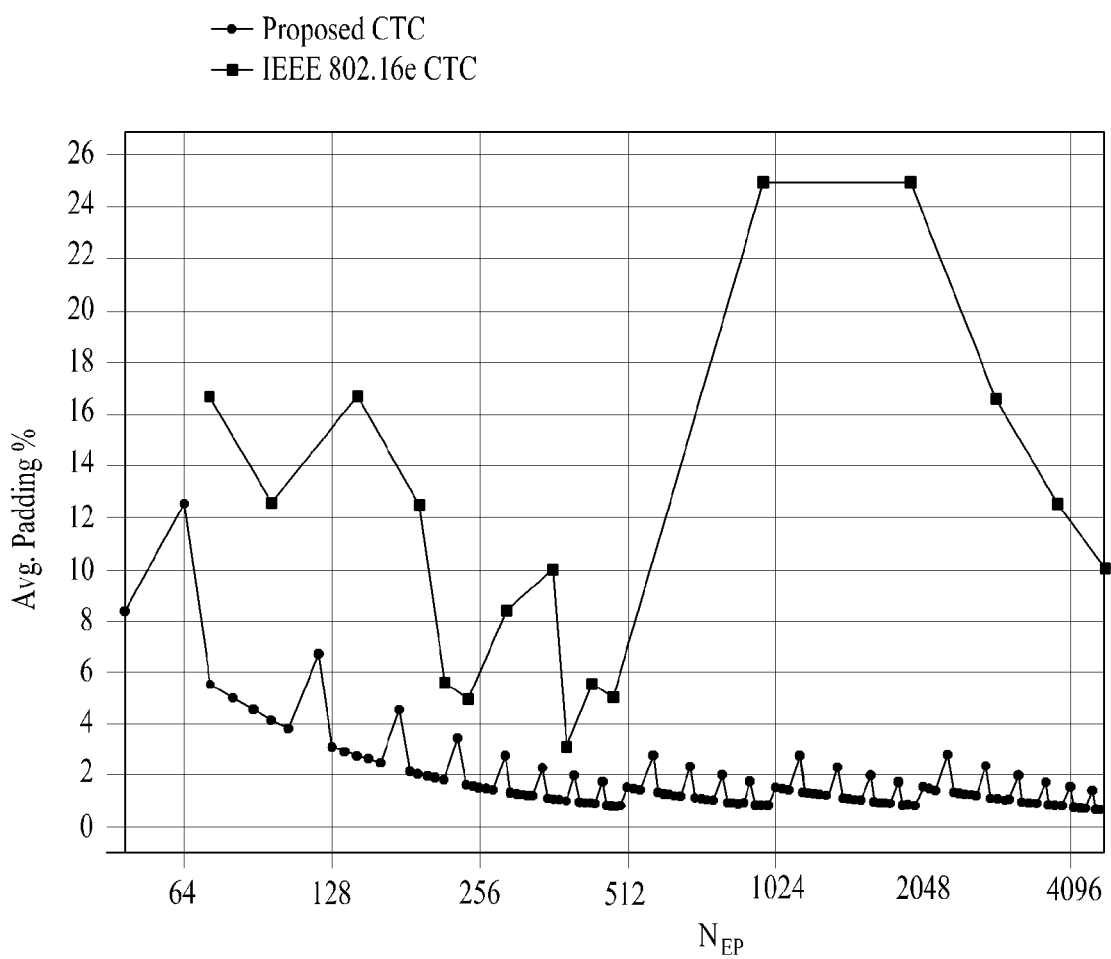
FIG. 1 illustrates simulation results of padding overhead according to CTC data block sizes suggested in Table 1.

Reference will now be made in detail to the preferred embodiments of the present invention with reference to the accompanying drawings. The detailed description, which will be given below with reference to the accompanying drawings, is intended to explain exemplary embodiments of the present invention, rather than to show the only embodiments that can be implemented according to the invention. The following detailed description includes specific details in order to provide a thorough understanding of the present invention. However, it will be apparent to those skilled in the art that the present invention may be practiced without such specific details. For example, although the following description will be given with reference to specific terms, the present invention is not necessarily limited to the specific terms and other terms may also be used to indicate the same meanings The same reference numbers will be used throughout this specification to refer to the same or like parts.

The expression "a portion includes a specific component" used throughout this specification indicates that the portion may also include other components, rather than including the specific component alone, unless explicitly stated otherwise.

Technologies described below can be used in various communication systems, which may provide various communication services such as voice and packet data services. The communication system technologies can be used in downlink or uplink. In the description of the present invention, the term "Base Station (BS)" may be replaced with another term such as "fixed station", "Node B", "eNode B (eNB)", "access point", or "ABS". The "Mobile Station (MS)" may also be replaced with another term such as "User Equipment (UE)", "Subscriber Station (SS)", "Mobile Subscriber Station (MSS)", "AMS", or "mobile terminal".

The term "transmitting end" refers to a node that transmits data or audio services and "receiving end" refers to a node that receives data or audio services. Thus, in uplink, the MS may be a transmitting end and the BS may be a receiving end. Similarly, in downlink, the MS may be a receiving end and the BS may be a transmitting end.

A Personal Digital Assistant (PDA), a cellular phone, a Personal Communication Service (PCS) phone, a Global System for Mobile (GSM) phone, a Wideband CDMA (WCDMA) phone, or a Mobile Broadband System (MBS) phone may be used as the MS in the present invention.

The embodiments of the present invention can be supported by standard documents of at least one of the Institute of Electrical and Electronics Engineers (IEEE) 802 system, the 3GPP system, the 3rd Generation Partnership Project Long Term Evolution (3GPP LTE) system, and the 3GPP2 system which are wireless access systems. That is, steps or portions that are not described in the embodiments of the present invention for the sake of clearly describing the spirit of the present invention can be supported by the standard documents. For all terms used in this disclosure, reference can be made to the standard documents. Especially, the embodiments of the present invention can be supported by P802.16-2004, P802.16e-2005, or P802.16Rev2 which are standard documents of the IEEE 802.16 system.

Specific terms used in the following description are provided for better understanding of the present invention and can be replaced with other terms without departing from the spirit of the present invention.

CTC data block size requirements in the IEEE 802.16m system are described as follows. First, data block sizes of the IEEE 802.16m system not only need to support data block sizes of the conventional IEEE 802.16e system but also need to be byte-aligned. The data block size is not a multiple of 7 to support a tail-biting encoding structure of CTC. It is preferable that the data block size set be designed to have better granularity to reduce padding overhead. In addition, the CTC data block size of the conventional IEEE 802.16e system needs to be supported by CTC of the IEEE 802.16m system. Each data block size needs to be increased to improve CTC performance and CTC interleaver parameters need to be optimized to achieve better CTC performance than in the IEEE 802.16e system. Rules of the CTC data block size together with granularity are described below.

1. Granularity for the data block sizes is increased taking into consideration padding overhead. First, it is preferable that a boundary data block size be defined so as to increase the granularity value. It is also preferable that granularity be defined taking into consideration the same padding parts of the boundary data block sizes.

2. It is preferable that the granularity value of the data block size is a multiple of 8 and byte-aligned.

3. As an exception to these rules, the granularity value may be twice as high as the desired granularity value in order to avoid data block sizes which are multiples of 7.

The CTC data block size rules are described below in more detail.

The boundary data block size used may be expressed as a power of 2 taking into consideration the minimum granularity value of 8. The boundary data block size may be 512, 1024, or 2048. The maximum padding bit portion may be fixed to 1.5625% of the entire boundary data block size.

For example, let us consider "40" and "48" as adjacent data block sizes. Here, the smaller data block size is 40 and the larger data block size is 48. A granularity value G may be defined by measuring the smaller data block size $N_{EP}$ among the two adjacent data block sizes. For example, G may be 8 when $40 \leq N_{EP} \leq 512$. On the other hand, G may be 16 when $512 \leq N_{EP} \leq 1024$, 32 when $1024 \leq N_{EP} \leq 2048$, and 64 when $2048 \leq N_{EP}$.

The greater data block size $N_{EP+}$ among the two adjacent data block sizes may be defined as follows.

For example, $N_{EP+} = N_{EP} + G$ when $(N_{EP}+G) \%7 \neq 0$, otherwise $N_{EP+} = N_{EP} + 2G$.

Here, %7 represents a modulo-7 operation.

According to these rules, the CTC data block size in the IEEE 802.16m system may be defined as shown in Table 1.

TABLE 2

| Index | $N_{EP}$ |
|---|---|
| 1 | 40 |
| 2 | 48 |
| 3 | 64 |
| 4 | 72 |
| 5 | 80 |
| 6 | 88 |
| 7 | 96 |
| 8 | 104 |
| 9 | 120 |
| 10 | 128 |
| 11 | 136 |
| 12 | 144 |
| 13 | 152 |
| 14 | 160 |
| 15 | 176 |
| 16 | 184 |
| 17 | 192 |
| 18 | 200 |
| 19 | 208 |
| 20 | 216 |
| 21 | 232 |
| 22 | 240 |
| 23 | 248 |
| 24 | 256 |
| 25 | 264 |
| 26 | 272 |
| 27 | 288 |
| 28 | 296 |
| 29 | 304 |
| 30 | 312 |
| 31 | 320 |
| 32 | 328 |
| 33 | 344 |
| 34 | 352 |
| 35 | 360 |
| 36 | 368 |
| 37 | 376 |
| 38 | 384 |
| 39 | 400 |
| 40 | 408 |
| 41 | 416 |
| 42 | 424 |
| 43 | 432 |
| 44 | 440 |
| 45 | 456 |
| 46 | 464 |
| 47 | 472 |
| 48 | 480 |
| 49 | 488 |
| 50 | 496 |
| 51 | 512 |
| 52 | 528 |
| 53 | 544 |
| 54 | 576 |
| 55 | 592 |
| 56 | 608 |
| 57 | 624 |
| 58 | 640 |
| 59 | 656 |
| 60 | 688 |
| 61 | 704 |
| 62 | 720 |
| 63 | 736 |
| 64 | 752 |
| 65 | 768 |
| 66 | 800 |
| 67 | 816 |
| 68 | 832 |
| 69 | 848 |
| 70 | 864 |
| 71 | 880 |
| 72 | 912 |
| 73 | 928 |
| 74 | 944 |
| 75 | 960 |
| 76 | 976 |
| 77 | 992 |
| 78 | 1024 |
| 79 | 1056 |
| 80 | 1088 |
| 81 | 1152 |
| 82 | 1184 |
| 83 | 1216 |
| 84 | 1248 |
| 85 | 1280 |
| 86 | 1312 |
| 87 | 1376 |
| 88 | 1408 |
| 89 | 1440 |
| 90 | 1472 |
| 91 | 1504 |
| 92 | 1536 |
| 93 | 1600 |
| 94 | 1632 |
| 95 | 1664 |
| 96 | 1696 |
| 97 | 1728 |
| 98 | 1760 |
| 99 | 1824 |
| 100 | 1856 |
| 101 | 1888 |
| 102 | 1920 |
| 103 | 1952 |
| 104 | 1984 |
| 105 | 2048 |
| 106 | 2112 |
| 107 | 2176 |
| 108 | 2304 |
| 109 | 2368 |
| 110 | 2432 |
| 111 | 2496 |

TABLE 2-continued

| Index | $N_{EP}$ |
|---|---|
| 112 | 2560 |
| 113 | 2624 |
| 114 | 2752 |
| 115 | 2816 |
| 116 | 2880 |
| 117 | 2944 |
| 118 | 3008 |
| 119 | 3072 |
| 120 | 3200 |
| 121 | 3264 |
| 122 | 3328 |
| 123 | 3392 |
| 124 | 3456 |
| 125 | 3520 |
| 126 | 3648 |
| 127 | 3712 |
| 128 | 3776 |
| 129 | 3840 |
| 130 | 3904 |
| 131 | 3968 |
| 132 | 4096 |
| 133 | 4160 |
| 134 | 4224 |
| 135 | 4288 |
| 136 | 4352 |
| 137 | 4416 |
| 138 | 4544 |
| 139 | 4608 |
| 140 | 4672 |
| 141 | 4736 |
| 142 | 4800 |

FIG. 1 illustrates simulation results of padding overhead according to CTC data block sizes suggested in Table 1.

Specifically, FIG. 1 illustrates results of comparison between padding overhead according to CTC data block sizes of the conventional IEEE 802.16e and padding overhead according to the CTC data block sizes suggested in the present invention. As can be seen from FIG. 1, the CTC data block sizes suggested in the present invention have excellent granularity and significantly reduce padding overhead, compared to the CTC data block sizes of the conventional IEEE 802.16e system.

Figure 2:
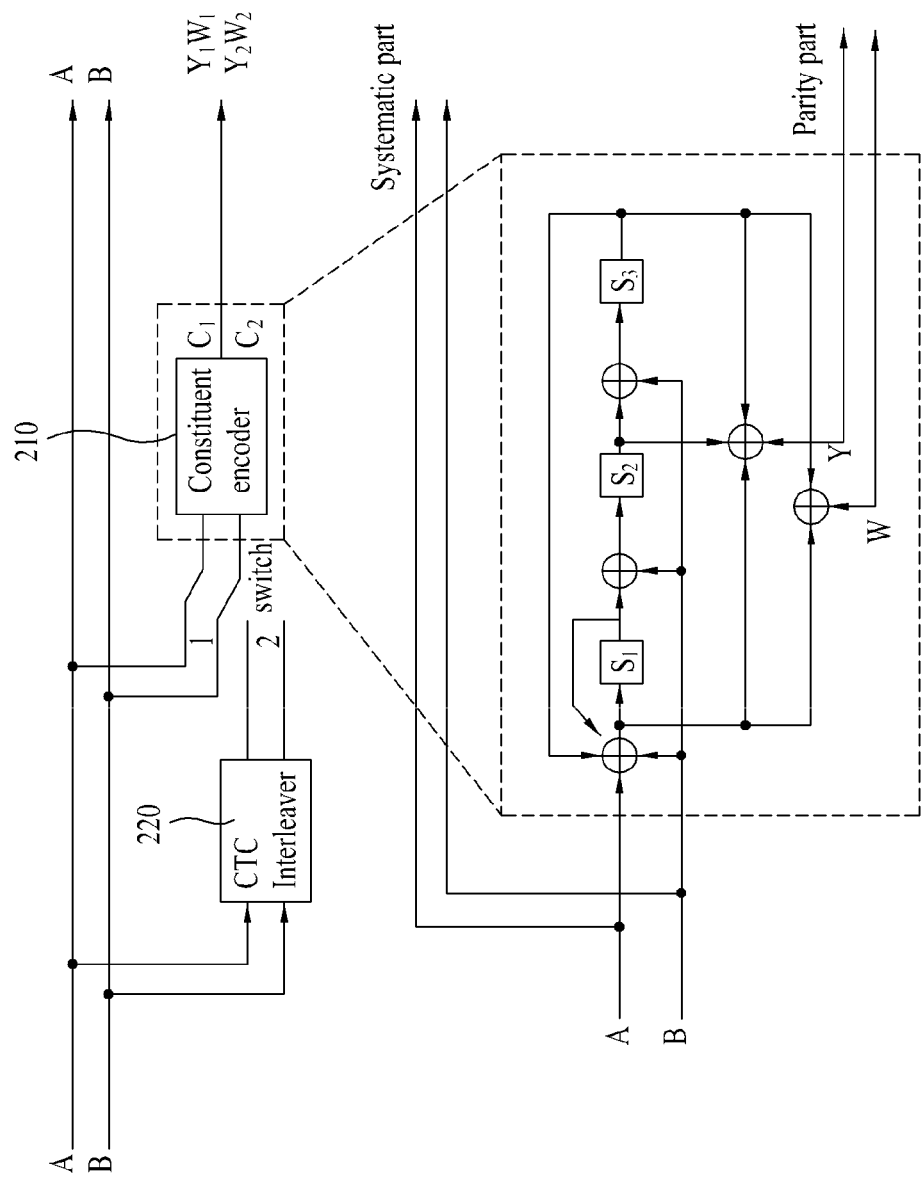
FIG. 2 illustrates a preferred embodiment of a CTC encoder according to the present invention.

FIG. 2 illustrates a preferred embodiment of a data transmission apparatus that transmits data using a Convolutional Turbo Code (CTC) encoder according to the present invention.

As shown in FIG. 2, the data transmission apparatus according to the present invention includes a constituent encoder 210, a CTC interleaver 220, and a transmission module (not shown).

When data bits (A, B) for coding are alternately input to the CTC encoder, the CTC encoder encodes the data bits (A, B) using a Dual Binary Circular Recursive Systematic Convolutional (CRSC) code. Data bits may be input to the CTC encoder on an $N_{EP}$-bit basis ($N_{EP}$=2×N bits) or on a N-bit-pair basis. Here, $N_{EP}$ indicates the CTC data block size (or CTC bit size).

The CTC encoder may perform encoding in two steps. In the first step, a switch provided in the CTC encoder is located to position 1 so that data bits (A, B) for coding is input to the constituent encoder 210 after an initialization process is performed through a circular operation. In the second step, the switch provided in the CTC encoder is switched to position 2 so that data bits (A, B) interleaved by the CTC interleaver 220 is input to the constituent encoder 210 after an initialization process is performed through a circular operation.

The CTC encoder may receive a signal from the outside or from an upper layer and may acquire $N_{EP}$ information having an encodable block size. Here, $N_{EP}$=2×N, where N is the actual interleaver size and N is CTC data block size/2.

Data bits (A,B) is alternately input to the constituent encoder 210 receive for encoding. Specifically, the Most Significant Bit (MSB) of a data bit sequence may be input as the data bit A and a next bit may be input as the data bit B. This procedure may be repeated for the entire bit sequence. Here, the MSB of a value is a binary number that most significantly affects the magnitude of the value in a bit-based operation. That is, the MSB is the leftmost bit in a bit sequence representing the value.

The constituent encoder 210 may encode data bits (A, B) received through two input ports. Here, the constituent encoder 210 may perform encoding in two steps. The constituent encoder 210 may include a first encoder $C_1$ that encodes data bits (A, B) received through the two input ports and a second encoder $C_2$ that encodes data bits (A, B) received through the two input ports after being interleaved by the CTC interleaver 220. How data bits are interleaved through the CTC interleaver 220 is described below in more detail.

The CTC interleaver 220 may interleave data bits (A, B) received through the two input ports. The CTC interleaver 220 may receive the MSB of a data bit sequence as the data bit A and then receive a next bit thereof as the data bit B. This procedure may be repeated for the entire bit sequence input to the CTC interleaver 220.

The CTC interleaver 220 randomizes a data bit sequence inputted in units of a predetermined size to be used for improving codeword distance properties.

The CTC encoder may sequentially output data bits (A, B) inputted through the two input ports and data bit values encoded through the constituent encoder 210. For example, the output bits may be "ABY1Y2W1W2" in the case of code rate ⅓. The output bits may be "ABY1Y2" through removal of "W1" and "W2" in the case of code rate ½. Here, the output data bits (A, B) correspond to a systematic part and the data bits (Y1, W1) or (Y2, W2) output through the constituent encoder 210 corresponding to a parity part. The size of data bits output at the parity part may vary depending on code rate.

The transmission module (not shown) may selectively transmit data bits received through the two input ports, first encoded bits output from the first encoder $C_1$, and second encoded bits output from the second encoder $C_2$.

The operation of the CTC interleaver 220 is briefly described as follows.

The CTC interleaver 220 performs interleaving in two steps according to CTC interleaver parameters $P_0$, $P_1$, $P_2$, and $P_3$.

In the first step, the CTC interleaver 220 performs bit pair swapping of the data bits (A, B) to be coded. Specifically, first, the CTC interleaver 220 swaps the positions of each pair of bits such that if($j_{mod\ 2}$==0) let (B,A)=(A,B) for j=0, 1, 2, ..., N−1. For example, let the input sequence be $u_0$=[($A_0$, $B_0$), ($A_1$, $B_1$), ($A_2$, $B_2$), ..., ($A_{N-1}$, $B_{N-1}$)]. The CTC interleaver 220 performs bit pair swapping on each even symbol in the first step. That is, when $u_1$ is the bit-pair-swapped sequence, $u_1$=[($A_0$, $B_0$), ($B_1$, $A_1$), ($A_2$, $B_2$), ..., ($B_{N-1}$, $A_{N-1}$)]=[$u_1$(0), $u_1$(1), $u_1$(2), ..., $u_1$(N−1)].

In the second step, the CTC interleaver 220 generates an interleaving address for swapped bit pair. The CTC interleaver 220 generates an interleaving address P(j) for a jth bit pair, completing the interleaving process. Here, P(j) may provide the address of the $u_1$ sequence. That is, $u_2$(j)=$u_1$(P(j)). As a result, $u_2$=[($B_{p(0)}$, $A_{p(0)}$), ($A_{p(1)}$, $B_{p(1)}$), ($B_{p(2)}$, $A_{p(2)}$), ..., ($A_{p(N-1)}$, $B_{p(N-1)}$)]. This sequence $u_2$ may be input to the second encoder.

The above process may be expressed as follows.

For j=0, 1, 2, ..., N−1, switch (j mod 4):
case 0: P(j)=(P$_0$·j+1) mod N:
case 1: P(j)=(P$_0$·j+1+N/2+P$_1$) mod N:
case 2: P(j)=(P$_0$·j+1+P$_2$) mod N:
case 3: P(j)=(P$_0$·j+1+N/2+P$_3$) mod N:

As described above, the CTC interleaver 220 may perform interleaving by swapping a pair of bits of each even symbol in the first step and generating an interleaving address on the j$^{th}$ bit pair according to the above expression in the second step. The generated address may be associated with a data block index and the CTC interleaver 220 may perform interleaving using the associated data block index and 4 corresponding CTC interleaver parameters.

A method for optimizing the CTC interleaver 220 in the IEEE 802.16m system is described below. The CTC interleaver 220 may be designed and optimized according to the CTC data block sizes according to the present invention.

The CTC interleaver structure in the IEEE 802.16m system may be reused. The CTC interleaver 220 knows CTC interleaver parameters (P$_0$, P$_1$, P$_2$, and P$_3$) corresponding to each data block size. The method may be performed using the 4 CTC interleaver parameters and the data block size in the following manner (Here, N is data block size/2).

The CTC interleaver may be designed and optimized taking into consideration the two steps of interleaving described above. The method for optimally designing CTC interleaver parameters may include the following steps.

In the first step, a spatial distance is calculated using a parameter test set. The following parameter test set may be considered, taking into account the CTC interleaver structure. That is, four parameters P$_0$, P$_1$, P$_2$, and P$_3$ preferably have the following characteristics.

First, P$_0$ is relatively prime to N.

P$_1$ is a natural number, which is a multiple of 2, such that P$_1$=0, 2, 4, ..., N−2.

P$_2$ is a natural number, which is a multiple of 4, such that P$_2$=0, 4, 8, ..., N−4.

P$_3$ is a natural number, which is a multiple of 2, such that P$_3$=0, 2, 4, ..., N−2 when P$_1$% 4=2 and is a natural number, which is a multiple of 4, such that P$_3$=0, 4, 8, ..., N−4 when P$_1$% 4=0.

Here, %4 represents a modulo-4 operation.

The spatial distance may be defined as in the following Expression 1.

$$S(j_1,j_2)=f(j_1,j_2)+f(\Pi(j_1),\Pi(j_2))$$ [Expression 1]

Here, f(u,v)=min [|u−v|,k−|u−v|] and f(j$_1$, j$_2$) denotes a distance before interleaving, f(Π(j$_1$),Π(j$_2$)) denotes a distance after interleaving. The spatial distance can be calculated for all index combinations (j$_1$, j$_2$). In addition, S$_{min}$ denotes the minimum spatial distance of the CTC interleaver among spatial distances of the index combinations.

Specifically, a parameter P$_0$, which is relatively prime number to N, is selected in the following manner.

Preferably, P$_0$ is an integer which is among relative prime numbers with N. However, for some data block sizes, S$_{min}$ may be sorted by magnitude. CTC interleaving patterns may be generated using all combinations (P$_1$, P$_2$, P$_3$)= {(0, 0, 0), (0, 0, 2), ..., (2, 0, 0), (2, 0, 2, or 4), ..., (N−2, N−4, N−2, or N−4) together with P$_0$. S$_{min}$ may be calculated for each combination of (P$_1$, P$_2$, P$_3$). After minimum spatial distances S$_{min}$ are calculated respectively for all parameter combinations, the top 5 parameter combinations may be extracted from among parameter combinations having the minimum spatial distances when the parameter combinations are sorted in decreasing order of the minimum spatial distance. The 5 parameter combinations having the minimum spatial distances sorted and extracted in this manner may be used in the second step of the method of designing and optimizing CTC interleaver parameters.

In the second step, a Return To Zero (RTZ) spatial distance may be calculated using the extracted parameter combinations. The RTZ sequence may be represented as follows taking into consideration CTC encoder generation polynomial equations.

| | | |
|---|---|---|
| idx1 − idx2 = 1 | Weight = 6 | 13 |
| idx1 − idx2 = 2 | Weight = 7 | 201 |
| idx1 − idx2 = 3 | Weight = 9 | 2003 |
| idx1 − idx2 = 4 | Weight = 9 | 30002 |
| idx1 − idx2 = 5 | Weight = 11 | 100002 |
| idx1 − idx2 = 6 | Weight = 10 | 3000001 |
| idx1 − idx2 = 7 | Weight = 12 | 10000001 |
| idx1 − idx2 = 7 | Weight = 14 | 20000002 |
| idx1 − idx2 = 7 | Weight = 12 | 30000003 |
| idx1 − idx2 = 8 | Weight = 14 | 100000003 |
| idx1 − idx2 = 9 | Weight = 15 | 2000000001 |
| idx1 − idx2 = 10 | Weight = 17 | 20000000003 |
| idx1 − idx2 = 11 | Weight = 17 | 300000000002 |
| idx1 − idx2 = 12 | Weight = 19 | 1000000000002 |
| idx1 − idx2 = 13 | Weight = 18 | 30000000000001 |
| idx1 − idx2 = 14 | Weight = 20 | 100000000000001 |
| idx1 − idx2 = 14 | Weight = 22 | 200000000000002 |
| idx1 − idx2 = 14 | Weight = 20 | 300000000000003 |
| . | | |
| . | | |
| . | | |

When the result of interleaving of an input RTZ sequence by applying bit pair swapping to the input RTZ sequence in the first step of the interleaving procedure is also an RTZ sequence, a spatial distance may be calculated for the RTZ sequence. Here, S$_{RTZ,min}$ is the minimum spatial distance of the RTZ sequence.

After minimum spatial distances S$_{RTZ,min}$ are calculated respectively for the each parameter combinations extracted in the first step, the calculated five minimum spatial distances S$_{RTZ,min}$ may sorted in decreasing order. Parameter combinations having the 5 minimum RTZ spatial distances obtained in this manner may be used in the third step of the method of designing and optimizing CTC interleaver parameters.

In the third step, the minimum distance is calculated using an Error IMpulse (EIM) method.

The CTC encoder may perform the EIM method using 2-bit data input to the CTC encoder. In order to calculate the minimum distance d$_{min}$ using interleaving patterns generated using the parameter combinations, each of the first and second encoders may perform the EIM method twice using the input bits A and B through its the first and second encoders. Thus, the minimum distance of code may be checked using the EIM method. Max-Log-MAP decoding having 64 repetitions may be used for the EIM method. This may be represented by the following algorithm.

```
set A_min = d_1 + 0.5
    for i=1 to n do
        A = d_0 −0.5;
        set[{x̂ = x}= TRUE
        while [{x̂ = x}= TRUE] and {A ≦ A_min −1.0}
    do
        * A= A+1.0 ;
        * y= {−1,•••, −1, −1+A, −1, −1,•••, −1}
```

-continued

```
    Where −1+A is in position i;
    * ML decoding of y  x̂;
    * if (x̂ ≠ x) then [{x̂ = x}= FALSE];
  end while
    A_min = A
  end for
d_min is the integer part of A_min
```

After minimum distances $d_{min}$ are calculated respectively for the each parameter combinations obtained in the second step, the top three minimum distances $d_{min}$ may be obtained when the calculated minimum distances $d_{min}$ are sorted in decreasing order. Parameter combinations having the three minimum distances $d_{min}$ obtained in this manner may be used in the last step, namely, the fourth step, of the method of designing and optimizing CTC interleaver parameters. Here, the minimum distance may represent a measure of performance since performance generally increases as the minimum distance increases.

In the fourth step, performance is estimated using mother code rates of ½ and ⅓. A BLock Error Rate (BLER) may be estimated after the motor code rate is set to ½ and ⅓ for the parameter combinations extracted in the third step. Parameter combinations which exhibit highest performance for all the code rates ½ and ⅓ may be selected after performance is estimated for each data block size.

The present invention suggests the following data block sizes and the following CTC interleaver parameters corresponding to the data block sizes according to the present invention described above. Some CTC interleaver parameters of the following Table 3 are changed from those of the Table 2.

TABLE 3

| Index | $N_{EP}$ | $P_0$ | $P_1$ | $P_2$ | $P_3$ |
|---|---|---|---|---|---|
| 1 | 48 | 5 | 0 | 0 | 0 |
| 2 | 64 | 11 | 12 | 0 | 12 |
| 3 | 72 | 11 | 18 | 0 | 18 |
| 4 | 80 | 7 | 4 | 32 | 36 |
| 5 | 88 | 13 | 36 | 36 | 32 |
| 6 | 96 | 13 | 24 | 0 | 24 |
| 7 | 104 | 7 | 4 | 8 | 48 |
| 8 | 120 | 11 | 30 | 0 | 34 |
| 9 | 128 | 13 | 46 | 44 | 30 |
| 10 | 136 | 13 | 58 | 4 | 58 |
| 11 | 144 | 11 | 6 | 0 | 6 |
| 12 | 152 | 11 | 38 | 12 | 74 |
| 13 | 160 | 13 | 68 | 76 | 64 |
| 14 | 176 | 17 | 52 | 68 | 32 |
| 15 | 184 | 13 | 2 | 0 | 2 |
| 16 | 192 | 7 | 58 | 48 | 10 |
| 17 | 200 | 11 | 76 | 0 | 24 |
| 18 | 208 | 11 | 10 | 32 | 42 |
| 19 | 216 | 11 | 54 | 56 | 2 |
| 20 | 232 | 11 | 70 | 60 | 58 |
| 21 | 240 | 13 | 60 | 0 | 60 |
| 22 | 248 | 13 | 6 | 84 | 46 |
| 23 | 256 | 11 | 64 | 8 | 8 |
| 24 | 264 | 13 | 72 | 68 | 8 |
| 25 | 272 | 13 | 82 | 44 | 38 |
| 26 | 288 | 17 | 74 | 72 | 2 |
| 27 | 296 | 13 | 0 | 84 | 64 |
| 28 | 304 | 13 | 130 | 112 | 46 |
| 29 | 312 | 11 | 32 | 124 | 108 |
| 30 | 320 | 17 | 84 | 108 | 132 |
| 31 | 328 | 17 | 148 | 160 | 76 |
| 32 | 344 | 17 | 160 | 116 | 52 |
| 33 | 352 | 17 | 106 | 56 | 50 |
| 34 | 360 | 17 | 40 | 132 | 128 |
| 35 | 368 | 19 | 88 | 0 | 172 |

TABLE 3-continued

| Index | $N_{EP}$ | $P_0$ | $P_1$ | $P_2$ | $P_3$ |
|---|---|---|---|---|---|
| 36 | 376 | 13 | 110 | 92 | 14 |
| 37 | 384 | 11 | 96 | 48 | 144 |
| 38 | 400 | 19 | 142 | 0 | 142 |
| 39 | 408 | 23 | 42 | 20 | 46 |
| 40 | 416 | 17 | 102 | 132 | 178 |
| 41 | 424 | 17 | 138 | 56 | 18 |
| 42 | 432 | 17 | 126 | 92 | 74 |
| 43 | 440 | 19 | 48 | 20 | 144 |
| 44 | 456 | 17 | 184 | 0 | 48 |
| 45 | 464 | 17 | 62 | 52 | 114 |
| 46 | 472 | 19 | 40 | 104 | 28 |
| 47 | 480 | 13 | 120 | 60 | 180 |
| 48 | 488 | 17 | 140 | 92 | 220 |
| 49 | 496 | 17 | 194 | 0 | 58 |
| 50 | 512 | 19 | 64 | 52 | 124 |
| 51 | 528 | 17 | 36 | 196 | 100 |
| 52 | 544 | 19 | 222 | 248 | 134 |
| 53 | 576 | 23 | 76 | 220 | 92 |
| 54 | 592 | 23 | 96 | 172 | 36 |
| 55 | 608 | 23 | 288 | 244 | 140 |
| 56 | 624 | 23 | 286 | 220 | 70 |
| 57 | 640 | 23 | 84 | 296 | 236 |
| 58 | 656 | 23 | 24 | 300 | 52 |
| 59 | 688 | 19 | 320 | 4 | 324 |
| 60 | 704 | 19 | 52 | 76 | 256 |
| 61 | 720 | 23 | 130 | 156 | 238 |
| 62 | 736 | 29 | 126 | 208 | 270 |
| 63 | 752 | 23 | 26 | 24 | 230 |
| 64 | 768 | 29 | 252 | 0 | 8 |
| 65 | 800 | 23 | 150 | 216 | 150 |
| 66 | 816 | 29 | 342 | 132 | 42 |
| 67 | 832 | 23 | 354 | 164 | 198 |
| 68 | 848 | 29 | 234 | 388 | 82 |
| 69 | 864 | 29 | 216 | 272 | 180 |
| 70 | 880 | 29 | 410 | 328 | 218 |
| 71 | 912 | 29 | 14 | 264 | 94 |
| 72 | 928 | 23 | 446 | 392 | 186 |
| 73 | 944 | 23 | 356 | 68 | 332 |
| 74 | 960 | 23 | 186 | 61 | 10 |
| 75 | 976 | 31 | 134 | 124 | 366 |
| 76 | 992 | 29 | 358 | 480 | 362 |
| 77 | 1024 | 29 | 320 | 236 | 324 |
| 78 | 1056 | 31 | 86 | 380 | 250 |
| 79 | 1088 | 31 | 432 | 216 | 524 |
| 80 | 1152 | 31 | 534 | 372 | 246 |
| 81 | 1184 | 31 | 2 | 568 | 94 |
| 82 | 1216 | 31 | 368 | 584 | 524 |
| 83 | 1248 | 31 | 88 | 404 | 608 |
| 84 | 1280 | 29 | 152 | 8 | 24 |
| 85 | 1312 | 31 | 214 | 160 | 506 |
| 86 | 1376 | 31 | 218 | 20 | 670 |
| 87 | 1408 | 29 | 474 | 584 | 118 |
| 88 | 1440 | 41 | 288 | 556 | 672 |
| 89 | 1472 | 29 | 164 | 424 | 76 |
| 90 | 1504 | 31 | 254 | 416 | 474 |
| 91 | 1536 | 31 | 34 | 564 | 710 |
| 92 | 1600 | 31 | 454 | 216 | 234 |
| 93 | 1632 | 29 | 334 | 564 | 66 |
| 94 | 1664 | 31 | 156 | 568 | 56 |
| 95 | 1696 | 37 | 722 | 136 | 698 |
| 96 | 1728 | 31 | 176 | 152 | 516 |
| 97 | 1760 | 23 | 646 | 484 | 850 |
| 98 | 1824 | 41 | 774 | 548 | 898 |
| 99 | 1856 | 47 | 576 | 212 | 728 |
| 100 | 1888 | 39 | 342 | 596 | 798 |
| 101 | 1920 | 43 | 318 | 556 | 778 |
| 102 | 1952 | 35 | 94 | 144 | 686 |
| 103 | 1984 | 43 | 84 | 488 | 92 |
| 104 | 2048 | 31 | 2 | 332 | 622 |
| 105 | 2112 | 43 | 96 | 720 | 980 |
| 106 | 2176 | 37 | 428 | 976 | 28 |
| 107 | 2304 | 41 | 16 | 484 | 888 |
| 108 | 2368 | 47 | 228 | 440 | 724 |
| 109 | 2432 | 43 | 452 | 888 | 96 |
| 110 | 2496 | 43 | 0 | 208 | 528 |
| 111 | 2560 | 53 | 264 | 488 | 824 |
| 112 | 2624 | 47 | 378 | 1092 | 1250 |
| 113 | 2752 | 37 | 430 | 880 | 970 |

TABLE 3-continued

| Index | $N_{EP}$ | $P_0$ | $P_1$ | $P_2$ | $P_3$ |
|---|---|---|---|---|---|
| 114 | 2816 | 31 | 624 | 704 | 400 |
| 115 | 2880 | 53 | 184 | 996 | 1336 |
| 116 | 2944 | 41 | 338 | 660 | 646 |
| 117 | 3008 | 43 | 916 | 1136 | 912 |
| 118 | 3072 | 53 | 184 | 824 | 1368 |
| 119 | 3200 | 43 | 1382 | 632 | 1086 |
| 120 | 3264 | 49 | 142 | 828 | 1354 |
| 121 | 3328 | 37 | 258 | 28 | 1522 |
| 122 | 3392 | 51 | 460 | 56 | 1608 |
| 123 | 3456 | 43 | 170 | 920 | 1518 |
| 124 | 3520 | 57 | 776 | 1232 | 1012 |
| 125 | 3648 | 49 | 132 | 720 | 276 |
| 126 | 3712 | 41 | 1328 | 772 | 1036 |
| 127 | 3776 | 53 | 772 | 256 | 408 |
| 128 | 3840 | 53 | 92 | 1124 | 476 |
| 129 | 3904 | 51 | 664 | 200 | 64 |
| 130 | 3968 | 57 | 1296 | 760 | 1360 |
| 131 | 4096 | 55 | 148 | 808 | 308 |
| 132 | 4160 | 79 | 214 | 308 | 262 |
| 133 | 4224 | 59 | 14 | 668 | 1474 |
| 134 | 4288 | 57 | 662 | 1516 | 42 |
| 135 | 4352 | 59 | 2052 | 712 | 1804 |
| 136 | 4416 | 59 | 1342 | 1968 | 1562 |
| 137 | 4544 | 65 | 1380 | 1068 | 1036 |
| 138 | 4608 | 67 | 954 | 1140 | 1566 |
| 139 | 4672 | 67 | 410 | 1020 | 114 |
| 140 | 4736 | 59 | 2 | 956 | 458 |
| 141 | 4800 | 53 | 66 | 24 | 2 |

Compared to Table 2, in the case of index 16, the data block size (or bit size) is 192 and the CTC interleaver parameters $P_0$, $P_1$, $P_2$, and $P_3$ are changed to 7, 58, 48, and 10. In the case of index 34, the data block size is 360 and the CTC interleaver parameters $P_0$, $P_1$, $P_2$, and $P_3$ are changed to 17, 40, 132, and 128, respectively. In the case of index 42, the data block size is 432 and the CTC interleaver parameters $P_0$, $P_1$, $P_3$, and $P_4$ are changed to 17, 126, 92, and 74, respectively. In the case of index 74, the data block size is 960 and the CTC interleaver parameters $P_0$, $P_1$, $P_2$, and $P_3$ are changed to 23, 186, 61, and 10, respectively. In the case of index 101, the data block size is 1920 and the CTC interleaver parameters $P_0$, $P_1$, $P_2$, and $P_3$ are changed to 43, 318, 556, and 778, respectively. In the case of index 115, the data block size is 2880 and the CTC interleaver parameters $P_0$, $P_1$, $P_2$, and $P_3$ are changed to 53, 184, 996, and 1336, respectively. In the case of index 128, the data block size is 3840 and the CTC interleaver parameters $P_0$, $P_1$, $P_2$, and $P_3$ are changed to 53, 92, 1124, and 476, respectively. The changed portions of Table 3 are shown in the following Table 4.

That is, Table 4 illustrates information of some data block sizes whose CTC interleaver parameters have been changed from those of Table 3.

TABLE 4

| Index | $N_{EP}$ | $P_0$ | $P_1$ | $P_2$ | $P_3$ |
|---|---|---|---|---|---|
| 16 | 192 | 7 | 58 | 48 | 10 |
| 34 | 360 | 17 | 40 | 132 | 128 |
| 42 | 432 | 17 | 126 | 92 | 74 |
| 74 | 960 | 23 | 186 | 61 | 10 |
| 101 | 1920 | 43 | 318 | 556 | 778 |
| 115 | 2880 | 53 | 184 | 996 | 1336 |
| 128 | 3840 | 53 | 92 | 1124 | 476 |

As shown in Table 4, new CTC interleaver parameters are provided for the data block sizes 192, 360, 432, 960, 1920, 2880, and 3840 in order to improve performance. The remaining CTC interleaver parameters may be identical to those of the IEEE 802.16e system to achieve downward compatibility (i.e., to support the legacy system).

The following Table 5 is created by removing 34 data block sizes and corresponding CTC interleaver parameters from those of Table 3 and adding 42 new data block sizes and corresponding CTC interleaver parameters.

TABLE 5

| Index | $N_{EP}$ | $P_0$ | $P_1$ | $P_2$ | $P_3$ |
|---|---|---|---|---|---|
| 1 | 48 | 5 | 0 | 0 | 0 |
| 2 | 64 | 11 | 12 | 0 | 12 |
| 3 | 72 | 11 | 18 | 0 | 18 |
| 4 | 80 | 7 | 4 | 32 | 36 |
| 5 | 88 | 13 | 36 | 36 | 32 |
| 6 | 96 | 13 | 24 | 0 | 24 |
| 7 | 104 | 7 | 4 | 8 | 48 |
| 8 | 120 | 11 | 30 | 0 | 34 |
| 9 | 128 | 13 | 46 | 44 | 30 |
| 10 | 136 | 13 | 58 | 4 | 58 |
| 11 | 144 | 11 | 6 | 0 | 6 |
| 12 | 152 | 11 | 38 | 12 | 74 |
| 13 | 160 | 13 | 68 | 76 | 64 |
| 14 | 176 | 17 | 52 | 68 | 32 |
| 15 | 184 | 13 | 2 | 0 | 2 |
| 16 | 192 | 7 | 58 | 48 | 10 |
| 17 | 200 | 11 | 76 | 0 | 24 |
| 18 | 208 | 11 | 10 | 32 | 42 |
| 19 | 216 | 11 | 54 | 56 | 2 |
| 20 | 232 | 11 | 70 | 60 | 58 |
| 21 | 240 | 13 | 60 | 0 | 60 |
| 22 | 248 | 13 | 6 | 84 | 46 |
| 23 | 256 | 11 | 64 | 8 | 8 |
| 24 | 264 | 13 | 72 | 68 | 8 |
| 25 | 272 | 13 | 82 | 44 | 38 |
| 26 | 288 | 17 | 74 | 72 | 2 |
| 27 | 296 | 13 | 0 | 84 | 64 |
| 28 | 304 | 13 | 130 | 112 | 46 |
| 29 | 312 | 11 | 32 | 124 | 108 |
| 30 | 320 | 17 | 84 | 108 | 132 |
| 31 | 328 | 17 | 148 | 160 | 76 |
| 32 | 344 | 17 | 160 | 116 | 52 |
| 33 | 352 | 17 | 106 | 56 | 50 |
| 34 | 360 | 17 | 40 | 132 | 128 |
| 35 | 368 | 19 | 88 | 0 | 172 |
| 36 | 376 | 13 | 110 | 92 | 14 |
| 37 | 384 | 11 | 96 | 48 | 144 |
| 38 | 400 | 19 | 142 | 0 | 142 |
| 39 | 416 | 17 | 102 | 132 | 178 |
| 40 | 432 | 17 | 126 | 92 | 74 |
| 41 | 440 | 19 | 48 | 20 | 144 |
| 42 | 456 | 17 | 184 | 0 | 48 |
| 43 | 472 | 19 | 40 | 104 | 28 |
| 44 | 480 | 13 | 120 | 60 | 180 |
| 45 | 496 | 17 | 194 | 0 | 58 |
| 46 | 512 | 19 | 64 | 52 | 124 |
| 47 | 528 | 17 | 36 | 196 | 100 |
| 48 | 544 | 19 | 222 | 248 | 134 |
| 49 | 552 | 13 | 198 | 180 | 190 |
| 50 | 568 | 19 | 102 | 140 | 226 |
| 51 | 584 | 21 | 74 | 20 | 214 |
| 52 | 600 | 31 | 12 | 272 | 28 |
| 53 | 608 | 23 | 288 | 244 | 140 |
| 54 | 624 | 23 | 286 | 220 | 70 |
| 55 | 640 | 23 | 84 | 296 | 236 |
| 56 | 656 | 23 | 24 | 300 | 52 |
| 57 | 664 | 23 | 272 | 220 | 60 |
| 58 | 680 | 19 | 48 | 240 | 144 |
| 59 | 696 | 31 | 252 | 216 | 48 |
| 60 | 712 | 25 | 214 | 180 | 286 |
| 61 | 720 | 23 | 130 | 156 | 238 |
| 62 | 736 | 29 | 126 | 208 | 270 |
| 63 | 752 | 23 | 26 | 24 | 230 |
| 64 | 768 | 29 | 252 | 0 | 8 |
| 65 | 776 | 29 | 100 | 196 | 140 |
| 66 | 800 | 23 | 150 | 216 | 150 |
| 67 | 824 | 29 | 130 | 332 | 42 |
| 68 | 848 | 29 | 234 | 388 | 82 |
| 69 | 872 | 29 | 408 | 300 | 316 |

TABLE 5-continued

| Index | $N_{EP}$ | $P_0$ | $P_1$ | $P_2$ | $P_3$ |
|---|---|---|---|---|---|
| 70 | 888 | 25 | 414 | 84 | 414 |
| 71 | 912 | 29 | 14 | 264 | 94 |
| 72 | 936 | 25 | 272 | 168 | 400 |
| 73 | 960 | 53 | 62 | 12 | 2 |
| 74 | 984 | 31 | 142 | 40 | 342 |
| 75 | 1000 | 29 | 290 | 148 | 446 |
| 76 | 1024 | 29 | 320 | 236 | 324 |
| 77 | 1048 | 27 | 424 | 212 | 416 |
| 78 | 1072 | 35 | 290 | 228 | 390 |
| 79 | 1096 | 23 | 178 | 392 | 430 |
| 80 | 1112 | 33 | 38 | 244 | 550 |
| 81 | 1136 | 37 | 170 | 276 | 134 |
| 82 | 1160 | 31 | 314 | 348 | 222 |
| 83 | 1184 | 31 | 2 | 568 | 94 |
| 84 | 1216 | 31 | 368 | 584 | 524 |
| 85 | 1248 | 31 | 88 | 404 | 608 |
| 86 | 1280 | 29 | 152 | 8 | 24 |
| 87 | 1312 | 31 | 214 | 160 | 506 |
| 88 | 1336 | 39 | 2 | 168 | 646 |
| 89 | 1368 | 29 | 570 | 348 | 574 |
| 90 | 1392 | 31 | 218 | 484 | 446 |
| 91 | 1424 | 31 | 676 | 124 | 184 |
| 92 | 1448 | 33 | 254 | 372 | 158 |
| 93 | 1480 | 31 | 32 | 716 | 736 |
| 94 | 1504 | 31 | 254 | 416 | 474 |
| 95 | 1536 | 31 | 34 | 564 | 710 |
| 96 | 1560 | 29 | 300 | 248 | 568 |
| 97 | 1600 | 31 | 454 | 216 | 234 |
| 98 | 1640 | 33 | 164 | 432 | 748 |
| 99 | 1672 | 35 | 164 | 368 | 700 |
| 100 | 1712 | 41 | 4 | 848 | 332 |
| 101 | 1752 | 31 | 314 | 656 | 666 |
| 102 | 1784 | 33 | 886 | 888 | 518 |
| 103 | 1824 | 41 | 774 | 548 | 898 |
| 104 | 1864 | 33 | 504 | 444 | 664 |
| 105 | 1896 | 35 | 936 | 940 | 832 |
| 106 | 1920 | 43 | 318 | 556 | 778 |
| 107 | 1952 | 35 | 94 | 144 | 686 |
| 108 | 2000 | 37 | 290 | 692 | 638 |
| 109 | 2048 | 31 | 2 | 332 | 622 |
| 110 | 2096 | 39 | 400 | 688 | 68 |
| 111 | 2144 | 29 | 298 | 252 | 610 |
| 112 | 2192 | 39 | 1074 | 148 | 710 |
| 113 | 2232 | 29 | 240 | 496 | 1100 |
| 114 | 2280 | 41 | 474 | 376 | 814 |
| 115 | 2328 | 41 | 254 | 884 | 1054 |
| 116 | 2368 | 47 | 228 | 440 | 724 |
| 117 | 2432 | 43 | 452 | 888 | 96 |
| 118 | 2496 | 43 | 0 | 208 | 528 |
| 119 | 2560 | 53 | 264 | 488 | 824 |
| 120 | 2624 | 47 | 378 | 1092 | 1250 |
| 121 | 2752 | 37 | 430 | 880 | 970 |
| 122 | 2816 | 31 | 624 | 704 | 400 |
| 123 | 2880 | 43 | 720 | 360 | 540 |
| 124 | 2944 | 41 | 338 | 660 | 646 |
| 125 | 3008 | 43 | 916 | 1136 | 912 |
| 126 | 3072 | 53 | 184 | 824 | 1368 |
| 127 | 3200 | 43 | 1382 | 632 | 1086 |
| 128 | 3264 | 49 | 142 | 828 | 1354 |
| 129 | 3328 | 37 | 258 | 28 | 1522 |
| 130 | 3392 | 51 | 460 | 56 | 1608 |
| 131 | 3456 | 43 | 170 | 920 | 1518 |
| 132 | 3520 | 57 | 776 | 1232 | 1012 |
| 133 | 3648 | 49 | 132 | 720 | 276 |
| 134 | 3712 | 41 | 1328 | 772 | 1036 |
| 135 | 3776 | 53 | 772 | 256 | 408 |
| 136 | 3840 | 53 | 92 | 1124 | 476 |
| 137 | 3904 | 51 | 664 | 200 | 64 |
| 138 | 3968 | 57 | 1296 | 760 | 1360 |
| 139 | 4096 | 55 | 148 | 808 | 308 |
| 140 | 4160 | 79 | 214 | 308 | 262 |
| 141 | 4224 | 59 | 14 | 668 | 1474 |
| 142 | 4288 | 57 | 662 | 1516 | 42 |
| 143 | 4352 | 59 | 2052 | 712 | 1804 |
| 144 | 4416 | 59 | 1342 | 1968 | 1562 |
| 145 | 4544 | 65 | 1380 | 1068 | 1036 |
| 146 | 4608 | 67 | 954 | 1140 | 1566 |
| 147 | 4672 | 67 | 410 | 1020 | 114 |
| 148 | 4736 | 59 | 2 | 956 | 458 |
| 149 | 4800 | 53 | 66 | 24 | 2 |

As shown in Table 5, the 42 newly added data block sizes are 552, 568, 584, 600, 664, 680, 696, 712, 776, 824, 872, 888, 936, 984, 1000, 1048, 1072, 1096, 1112, 1136, 1160, 1336, 1368, 1392, 1424, 1448, 1480, 1560, 1640, 1672, 1712, 1752, 1784, 1864, 1896, 2000, 2096, 2144, 2192, 2232, 2280, and 2328.

Table 6 shows 39 data block sizes, which are preferable for use in interleaving among data block sizes shown in Table 5, and CTC interleaver parameters values corresponding to the 39 data block sizes.

TABLE 6

| Index | $N_{EP}$ | $P_0$ | $P_1$ | $P_2$ | $P_3$ |
|---|---|---|---|---|---|
| 1 | 48 | 5 | 0 | 0 | 0 |
| 2 | 64 | 11 | 12 | 0 | 12 |
| 3 | 72 | 11 | 18 | 0 | 18 |
| 4 | 80 | 7 | 4 | 32 | 36 |
| 5 | 88 | 13 | 36 | 36 | 32 |
| 6 | 96 | 13 | 24 | 0 | 24 |
| 7 | 104 | 7 | 4 | 8 | 48 |
| 8 | 120 | 11 | 30 | 0 | 34 |
| 9 | 136 | 13 | 58 | 4 | 58 |
| 10 | 152 | 11 | 38 | 12 | 74 |
| 11 | 176 | 17 | 52 | 68 | 32 |
| 12 | 200 | 11 | 76 | 0 | 24 |
| 13 | 216 | 11 | 54 | 56 | 2 |
| 14 | 248 | 13 | 6 | 84 | 46 |
| 15 | 288 | 17 | 74 | 72 | 2 |
| 16 | 320 | 17 | 84 | 108 | 132 |
| 17 | 352 | 17 | 106 | 56 | 50 |
| 18 | 400 | 19 | 142 | 0 | 142 |
| 19 | 456 | 17 | 184 | 0 | 48 |
| 20 | 512 | 19 | 64 | 52 | 124 |
| 21 | 568 | 19 | 102 | 140 | 226 |
| 22 | 640 | 23 | 84 | 296 | 236 |
| 23 | 720 | 23 | 130 | 156 | 238 |
| 24 | 800 | 23 | 150 | 216 | 150 |
| 25 | 912 | 29 | 14 | 264 | 94 |
| 26 | 1024 | 29 | 320 | 236 | 324 |
| 27 | 1160 | 31 | 314 | 348 | 222 |
| 28 | 1312 | 31 | 214 | 160 | 506 |
| 29 | 1448 | 33 | 254 | 372 | 158 |
| 30 | 1640 | 33 | 164 | 432 | 748 |
| 31 | 1864 | 33 | 504 | 444 | 664 |
| 32 | 2096 | 39 | 400 | 688 | 68 |
| 33 | 2328 | 41 | 254 | 884 | 1054 |
| 34 | 2624 | 47 | 378 | 1092 | 1250 |
| 35 | 2944 | 41 | 338 | 660 | 646 |
| 36 | 3328 | 37 | 258 | 28 | 1522 |
| 37 | 3776 | 53 | 772 | 256 | 408 |
| 38 | 4224 | 59 | 14 | 668 | 1474 |
| 39 | 4800 | 53 | 66 | 24 | 2 |

The CTC interleaver parameter tables may be expressed according to data block sizes as described above with reference to Tables 2 to 6 according to the CTC interleaver design and optimization procedure according to the present invention.

Figure 3:
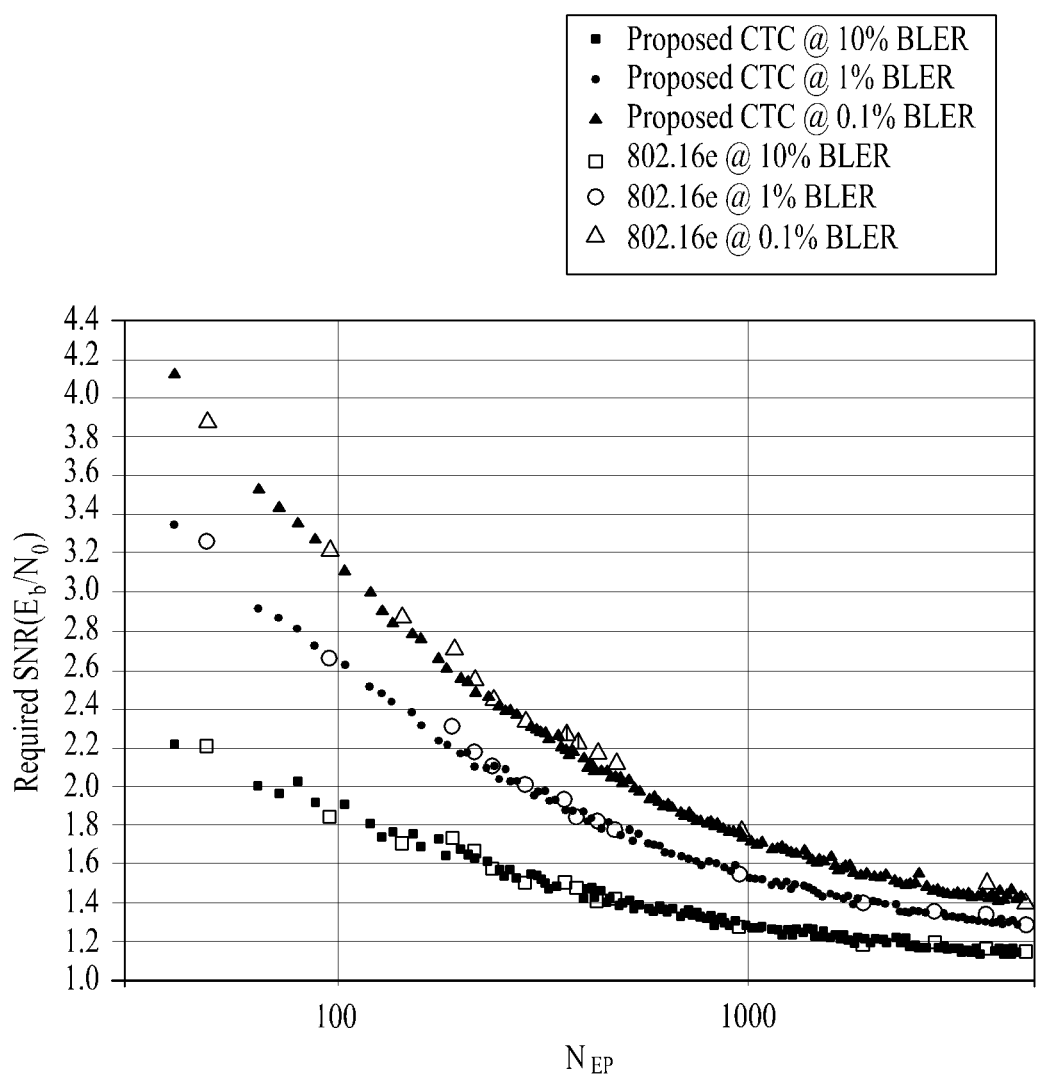
FIGS. 3 and 4 illustrate comparison between BLER performance of a CTC interleaver using data block sizes and CTC interleaver parameters suggested in the present invention and BLER performance of the conventional IEEE 802.16e CTC interleaver for each mother code rate.
Figure 4:
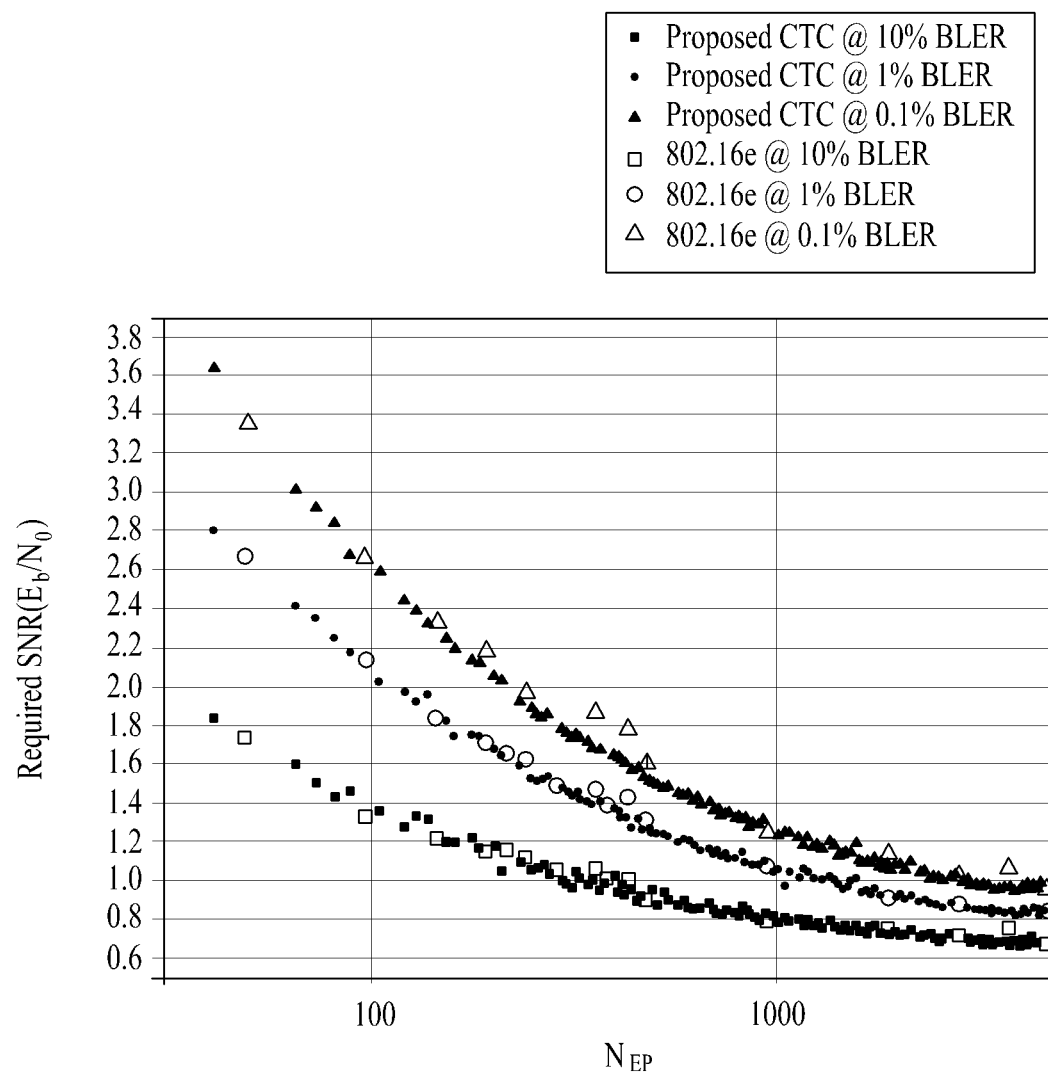

FIGS. 3 and 4 illustrate comparison between BLER performance of a CTC interleaver using data block sizes and CTC interleaver parameters suggested in the present invention and BLER performance of the conventional IEEE 802.16e CTC interleaver for each mother code rate.

Specifically, FIGS. 3 and 4 illustrate comparison between a Signal to Noise Ratio (SNR) required for the data block size when mother code rate is ½ and ⅓ and when BLER is 10%, 1%, and 0.1%. Performance increases as the data block size increases since the SNR decreases as the data block size increases as shown in FIGS. 3 and 4. This indicates that the performance of the CTC interleaver according to the present invention is better than the CTC interleaver of the conventional IEEE 802.16m system using small data block sizes.

The apparatus and method for transmitting data using the CTC interleaver have been described above. An apparatus and method for receiving data using the CTC interleaver corresponding to the transmission apparatus and method are described below with reference to the above description.

The apparatus for receiving data using the CTC interleaver may include a first decoder that decodes received values of data bits input through two input terminals and outputs a Log Likelihood Ratio (LLR) of first decoded bits, a CTC interleaver that interleaves received values of the input data bits using 4 CTC interleaver parameters $P_0$, $P_1$, $P_2$, and $P_3$ corresponding to the size of the input data bits, and a second decoder that decodes the received value of the interleaved data bits and outputs a Log Likelihood Ratio (LLR) of second decoded bits. The functions and processes of the interleaver of the CTC decoder are identical to those of the interleaver of the CTC encoder. Thus, a detailed description of the interleaver of the CTC decoder is omitted herein.

The above embodiments are provided by combining components and features of the present invention in specific forms. The components or features of the present invention should be considered optional unless explicitly stated otherwise. The components or features may be implemented without being combined with other components or features. The embodiments of the present invention may also be provided by combining some of the components and/or features. The order of the operations described above in the embodiments of the present invention may be changed. Some components or features of one embodiment may be included in another embodiment or may be replaced with corresponding components or features of another embodiment. It will be apparent that claims which are not explicitly dependent on each other can be combined to provide an embodiment or new claims can be added through amendment after this application is filed.

The embodiments of the present invention can be implemented by hardware, firmware, software, or any combination thereof. In the case where the present invention is implemented by hardware, an embodiment of the present invention may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, or the like.

In the case where the present invention is implemented by firmware or software, the embodiments of the present invention may be implemented in the form of modules, processes, functions, or the like which perform the features or operations described above. Software code can be stored in a memory unit so as to be executed by a processor. The memory unit may be located inside or outside the processor and can communicate data with the processor through a variety of known means.

As is apparent from the above description, an apparatus and method for a transmitting end to transmit data using a Convolutional Turbo Code (CTC) encoder in a mobile communication system according to the present invention have a variety of advantages.

For example, it is possible to significantly reduce padding overhead by applying additional input data bit sizes suggested in the present invention.

The reduction of the padding overhead also enables more efficient data transmission.

The apparatus and method for transmitting data using a CTC interleaver according to the present invention can be used industrially.

Those skilled in the art will appreciate that the present invention may be embodied in other specific forms than those set forth herein without departing from the spirit and essential characteristics of the present invention. The above description is therefore to be construed in all aspects as illustrative and not restrictive. The scope of the invention should be determined by reasonable interpretation of the appended claims and all changes coming within the equivalency range of the invention are intended to be embraced in the scope of the invention.

What is claimed is:

1. A method of transmitting data using a Convolutional Turbo Code (CTC) encoder by a transmitting end in a mobile communication system, the method comprising:
   providing input data bits; and
   interleaving the input data bits using 4 CTC interleaver parameters ($P_0$, $P_1$, $P_2$, and $P_3$) corresponding to a size of the input data bits inputted to two input ports of a CTC interleaver,
   wherein the size ($N_{EP}$) of the input data bits is one of bit sizes in Table A, and
   wherein $P_0$, $P_1$, $P_2$, and $P_3$ corresponding to the size ($N_{EP}$) of the input data bit are determined as one row selected among in Table A:

TABLE A

| Index | $N_{EP}$ | $P_0$ | $P_1$ | $P_2$ | $P_3$ |
|---|---|---|---|---|---|
| 1 | 64 | 11 | 12 | 0 | 12 |
| 2 | 80 | 7 | 4 | 32 | 36 |
| 3 | 88 | 13 | 36 | 36 | 32 |
| 4 | 104 | 7 | 4 | 8 | 48 |
| 5 | 120 | 11 | 30 | 0 | 34 |
| 6 | 136 | 13 | 58 | 4 | 58 |
| 7 | 152 | 11 | 38 | 12 | 74 |
| 8 | 176 | 17 | 52 | 68 | 32 |
| 9 | 200 | 11 | 76 | 0 | 24 |
| 10 | 248 | 13 | 6 | 84 | 46 |
| 11 | 320 | 17 | 84 | 108 | 132 |
| 12 | 352 | 17 | 106 | 56 | 50 |
| 13 | 400 | 19 | 142 | 0 | 142 |
| 14 | 456 | 17 | 184 | 0 | 48 |
| 15 | 512 | 19 | 64 | 52 | 124 |
| 16 | 568 | 19 | 102 | 140 | 226 |
| 17 | 640 | 23 | 84 | 296 | 236 |
| 18 | 720 | 23 | 130 | 156 | 238 |
| 19 | 800 | 23 | 150 | 216 | 150 |
| 20 | 912 | 29 | 14 | 264 | 94 |
| 21 | 1024 | 29 | 320 | 236 | 324 |
| 22 | 1152 | 31 | 534 | 372 | 246 |
| 23 | 1312 | 31 | 214 | 160 | 506 |
| 24 | 1440 | 41 | 288 | 556 | 672 |
| 25 | 1632 | 29 | 334 | 564 | 66 |
| 26 | 1856 | 47 | 576 | 212 | 728 |
| 27 | 2112 | 43 | 96 | 720 | 980 |
| 28 | 2368 | 47 | 228 | 440 | 724 |
| 29 | 2624 | 47 | 378 | 1092 | 1250 |
| 30 | 2944 | 41 | 338 | 660 | 646 |
| 31 | 3328 | 37 | 258 | 28 | 1522 |
| 32 | 3776 | 53 | 772 | 256 | 408 |
| 33 | 4224 | 59 | 14 | 668 | 1474. |

2. The method according to claim 1, wherein the CTC interleaver parameter $P_0$ is an integer close to $\sqrt{2N}$ among the relative prime numbers with N.

3. The method according to claim 1, wherein the size ($N_{EP}$) of the input data bits include at least one additional bit size, other than 48, 72, 96, 144, 192, 216, 240, 288, 360, 384, 432, 480, 960, 1920, 2800, 3840, and 4800 bits, within a size range between 48 bits to 4800 bits.

4. The method according to claim 1, wherein $P_0$ is relative prime number with N which is ½ of the size ($N_{EP}$) of the input data bits, $P_1$ is a multiple of 2 among a number set, $P_2$ is a multiple of 4 among the number set, wherein the number set is defined by a set of integers greater than zero, and wherein $P_3$ is a multiple of 2 among the number set when ($P_1$ modulo 4)=2, and $P_3$ is a multiple of 4 among the number set when ($P_1$ modulo 4)=0.

5. The apparatus according to claim 1, wherein $P_0$ is relative prime number with N which is ½ of the size ($N_{EP}$) of the input data bits, $P_1$ is a multiple of 2 among a number set, $P_2$ is a multiple of 4 among the number set, wherein the number set is defined by a set of integers greater than zero, and wherein $P_3$ is a multiple of 2 among the number set when ($P_1$ modulo 4)=2, and $P_3$ is a multiple of 4 among the number set when ($P_1$ modulo 4)=0.

6. An apparatus for transmitting data using a Convolutional Turbo Code (CTC) encoder in a mobile communication system, the apparatus comprising:
  a provider for providing input data bits; and
  a CTC interleaver for interleaving the input data bits using 4 CTC interleaver parameters ($P_0$, $P_1$, $P_2$, and $P_3$) corresponding to a size of the input data bits,
  wherein the size ($N_{EP}$) of the input data bits is one of bit sizes in Table A, and
  wherein $P_0$, $P_1$, $P_2$, and $P_3$ corresponding to the size ($N_{EP}$) of the input data bit are determined as one row selected among in Table A:

TABLE A

| Index | $N_{EP}$ | $P_0$ | $P_1$ | $P_2$ | $P_3$ |
|---|---|---|---|---|---|
| 1 | 64 | 11 | 12 | 0 | 12 |
| 2 | 80 | 7 | 4 | 32 | 36 |
| 3 | 88 | 13 | 36 | 36 | 32 |
| 4 | 104 | 7 | 4 | 8 | 48 |
| 5 | 120 | 11 | 30 | 0 | 34 |
| 6 | 136 | 13 | 58 | 4 | 58 |
| 7 | 152 | 11 | 38 | 12 | 74 |
| 8 | 176 | 17 | 52 | 68 | 32 |
| 9 | 200 | 11 | 76 | 0 | 24 |
| 10 | 248 | 13 | 6 | 84 | 46 |
| 11 | 320 | 17 | 84 | 108 | 132 |
| 12 | 352 | 17 | 106 | 56 | 50 |
| 13 | 400 | 19 | 142 | 0 | 142 |
| 14 | 456 | 17 | 184 | 0 | 48 |
| 15 | 512 | 19 | 64 | 52 | 124 |
| 16 | 568 | 19 | 102 | 140 | 226 |
| 17 | 640 | 23 | 84 | 296 | 236 |
| 18 | 720 | 23 | 130 | 156 | 238 |
| 19 | 800 | 23 | 150 | 216 | 150 |
| 20 | 912 | 29 | 14 | 264 | 94 |
| 21 | 1024 | 29 | 320 | 236 | 324 |
| 22 | 1152 | 31 | 534 | 372 | 246 |
| 23 | 1312 | 31 | 214 | 160 | 506 |
| 24 | 1440 | 41 | 288 | 556 | 672 |
| 25 | 1632 | 29 | 334 | 564 | 66 |
| 26 | 1856 | 47 | 576 | 212 | 728 |
| 27 | 2112 | 43 | 96 | 720 | 980 |
| 28 | 2368 | 47 | 228 | 440 | 724 |
| 29 | 2624 | 47 | 378 | 1092 | 1250 |
| 30 | 2944 | 41 | 338 | 660 | 646 |
| 31 | 3328 | 37 | 258 | 28 | 1522 |
| 32 | 3776 | 53 | 772 | 256 | 408 |
| 33 | 4224 | 59 | 14 | 668 | 1474. |

7. The apparatus according to claim 6, wherein the CTC interleaver parameter $P_0$ is an integer close to $\sqrt{2N}$ among relative prime numbers with N.

8. The apparatus according to claim 6, wherein the size ($N_{EP}$) of the input data bits include at least one additional bit size, other than 48, 72, 96, 144, 192, 216, 240, 288, 360, 384, 432, 480, 960, 1920, 2800, 3840, and 4800 bits, within a size range between 48 bits to 4800 bits.

* * * * *